(12) United States Patent
Yamahira

(10) Patent No.: US 12,476,591 B2
(45) Date of Patent: Nov. 18, 2025

(54) OSCILLATOR CIRCUIT AND BUFFER CIRCUIT

(71) Applicant: Nuvoton Technology Corporation Japan, Kyoto (JP)

(72) Inventor: Seiji Yamahira, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/807,346

(22) Filed: Aug. 16, 2024

(65) Prior Publication Data

US 2024/0405720 A1 Dec. 5, 2024

Related U.S. Application Data

(63) Continuation of application No. PCT/JP2023/004668, filed on Feb. 10, 2023.

(30) Foreign Application Priority Data

Feb. 24, 2022 (JP) ................................. 2022-027099

(51) Int. Cl.
*H03B 5/24* (2006.01)
*H03B 5/04* (2006.01)

(52) U.S. Cl.
CPC ................ *H03B 5/24* (2013.01); *H03B 5/04* (2013.01); *H03B 2200/0034* (2013.01)

(58) Field of Classification Search
CPC . H03B 5/24; H03B 5/04; H03B 5/364; H03B 5/32; H03B 5/36; H03B 2200/0034; H03F 1/02
See application file for complete search history.

(56) References Cited

U.S. PATENT DOCUMENTS

2022/0131499 A1* 4/2022 Jefremow ................ H03B 5/36

FOREIGN PATENT DOCUMENTS

| JP | H05-145341 A | 6/1993 |
| JP | 2005-210403 A | 8/2005 |
| JP | 2012-205141 A | 10/2012 |
| JP | 6111085 B2 | 4/2017 |

OTHER PUBLICATIONS

International Search Report dated May 9, 2023 issued in International Patent Application No. PCT/JP2023/004668, with English machine translation.

* cited by examiner

*Primary Examiner* — Jeffrey M Shin
(74) *Attorney, Agent, or Firm* — Rimon P.C.

(57) ABSTRACT

An oscillator circuit includes an oscillator and an amplifier circuit that amplifies a voltage of the oscillator. The amplifier circuit includes a first inverter that outputs signals to a first node and a second node, a second inverter that outputs an output signal to a third node when the signals are inputted to the first node and the second node, and a variable resistor connected between the first node and the second node and controlled by a control signal.

7 Claims, 11 Drawing Sheets

OSCILLATOR CIRCUIT AND BUFFER CIRCUIT

CROSS REFERENCE TO RELATED APPLICATION

This is a continuation application of PCT International Application No. PCT/JP2023/004668 filed on Feb. 10, 2023, designating the United States of America, which is based on and claims priority of Japanese Patent Application No. 2022-027099 filed on Feb. 24, 2022. The entire disclosures of the above-identified applications, including the specifications, drawings and claims are incorporated herein by reference in their entirety.

FIELD

The present disclosure relates to an oscillator circuit and a buffer circuit.

BACKGROUND

An oscillator circuit using an oscillator, such as a crystal, is brought into a steady oscillation state by inverting and amplifying, with an amplifier circuit including an inverter and the like, a minute voltage generated by the oscillator when the oscillator circuit is activated, and by repeatedly feeding the amplified voltage back to the oscillator. The oscillator circuit is required to perform stable oscillation operation and desired to be driven with low power consumption both when the oscillator circuit is activated and when the oscillator circuit is in the steady oscillation state. In order to satisfy such a requirement, a configuration in which a drain current of a pMOS transistor included in an inverter in an amplifier circuit is controlled according to an amplitude voltage of an oscillating signal is conventionally proposed (Patent Literature (PTL) 1). Moreover, another example proposed is a configuration in which, in inverters connected in series of three stages and included in an amplifier circuit, a through current of an inverter in the third stage is suppressed by connecting a resistor between ground VSS and an nMOS transistor of one inverter of two inverters connected in parallel in the second stage, connecting an output from the one inverter to a gate of a pMOS transistor of the inverter in the third stage, connecting a resistor between power supply voltage VDD and a pMOS transistor of an other inverter of the two inverters in the second stage, and connecting an output from the other inverter to a gate of an nMOS transistor of the inverter in the third stage (PTL 2).

CITATION LIST

Patent Literature

PTL 1: Japanese Patent No. 6111085
PTL2: Japanese Unexamined Patent Application Publication No. H05-145341

SUMMARY

Technical Problem

However, in the configuration described in PTL 1, although current consumption of the amplifier circuit is reduced, a through current generated in the inverter during a logic transition is not sufficiently reduced and wasteful current consumption occurs. Moreover, in the configuration described in PTL 2, although a through current of the inverter in the third stage can be reduced in a steady oscillation state, since a direct current voltage level (hereinafter, a direct current voltage outputted from an inverter is also referred to as a DC voltage) of each of the two inverters in the second stage becomes, by the resistor, a value close to power supply voltage VDD or ground VSS when an oscillator circuit is activated, the inverter in the third stage is not brought into the ON state by a minute voltage generated when the oscillator circuit is activated, and therefore an oscillating signal cannot be generated. Moreover, since the two inverters in the second stage are connected in parallel, the area of the circuit becomes large.

In view of the above, the present disclosure realizes, with a small circuit area, stable oscillation operation from when an oscillator circuit is activated and a minute voltage is generated to when the oscillator circuit is in a steady oscillation state, and provides the oscillator circuit that can be driven with low power consumption in the steady oscillation state.

Solution to Problem

In view of the above, an oscillator circuit according to the present disclosure includes an oscillator and an amplifier circuit that amplifies a voltage of the oscillator. The amplifier circuit includes a first inverter that outputs signals to a first node and a second node, a second inverter that outputs an output signal to a third node when the signals are inputted to the first node and the second node, and a variable resistor connected between the first node and the second node and controlled by a control signal.

Advantageous Effects

By controlling, with a control signal, a variable resistor included in an inverter so that the resistance value of the variable resistor when the oscillator circuit is activated is different from the resistance value of the variable resistor when the oscillator circuit is in the steady oscillation state, an oscillator circuit according to the present disclosure can realize stable oscillation operation from when the oscillator circuit is activated to when the oscillator circuit is in a steady oscillation state and can reduce power consumption caused by a through current when the oscillator circuit is in the steady oscillation state.

Moreover, since the resistance value of the variable resistor is set by ON-resistance of a transistor, the area of the oscillator circuit can be made small.

Furthermore, since the resistance value of the variable resistor is switched between multiple values, an optimal delay time can be set for node Np or node Nn even when the oscillation frequency of the oscillator circuit is changed, and the oscillator circuit can be applied in a wide use. It should be noted that the multiple values mean three or more values.

Furthermore, since the variable resistor includes a clamping circuit, a logic transition of a voltage of node Np and node Nn occurs in two steps, and the voltage after the logic transition is inputted to a downstream inverter, a through current of the downstream inverter, fluctuation in a power supply voltage during the logic transition, and degradation in EMI characteristics can be suppressed. Furthermore, a supply current to an oscillator can be suppressed, and a margin of an amplitude can be increased.

Furthermore, even when the above-described amplifier circuit is used as a buffer circuit, low power consumption, suppression of fluctuation in power supply voltage, and improvement of EMI characteristics can be realized.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Hereinafter, an embodiment of the present disclosure is described in detail with reference to the Drawings. It should be noted that in the embodiment, elements that have the same function share like reference signs, and overlapping descriptions thereof are omitted.

Figure 1:
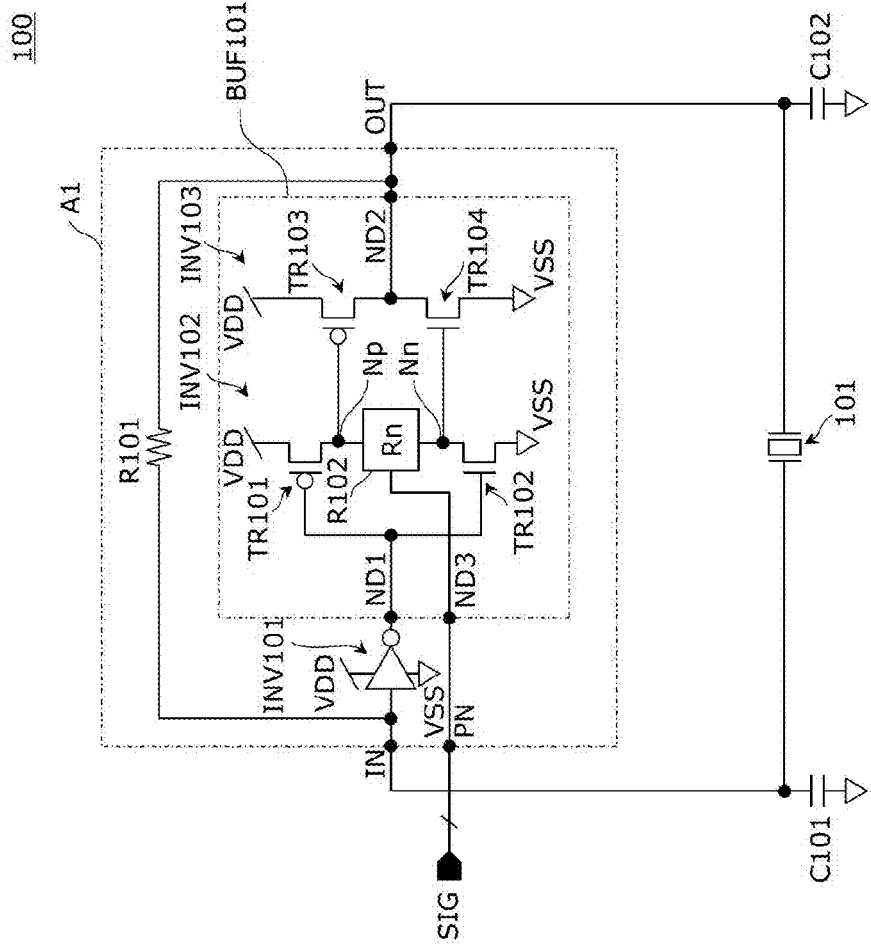
FIG. 1 is a circuit diagram illustrating a configuration of an oscillator circuit according to Embodiment 1 of the present disclosure.

Embodiment 1 of the present disclosure is described with reference to the Drawings. FIG. 1 is a circuit diagram illustrating a configuration of oscillator circuit 100 of the present disclosure, and 101 denotes an oscillator, C101 and C102 denote load capacitors connected to both ends of oscillator 101, A1 denotes an amplifier circuit that amplifies a voltage generated by oscillator 101 and feeds the voltage amplified back to oscillator 101, and SIG denotes a control signal that controls amplifier circuit A1. As illustrated in FIG. 1, oscillator circuit 100 includes oscillator 101 and amplifier circuit A1.

Amplifier circuit A1 includes input terminal IN, output terminal OUT, control terminal PN to which control signal SIG is inputted, inverter INV101, buffer circuit BUF101, and feedback resistor R101 that feeds voltage VOUT of output terminal OUT back to input terminal IN. Here, voltage VOUT is fed back for setting VIN_dc that is a direct current voltage (hereinafter, a direct current voltage inputted to an inverter is referred to as a DC bias) of inverter INV101.

Buffer circuit BUF101 includes node ND1 that is an input node, node ND2 that is an output node, and node ND3 to which control signal SIG is applied via control terminal PN.

Buffer circuit BUF101 includes inverter INV102 and inverter INV103.

Inverter INV102 is an example of a first inverter that outputs signals to node Np and node Nn. Node Np is an example of a first node, and node Nn is an example of a second node.

Inverter INV102 further includes pMOS transistor TR101 and nMOS transistor TR102 to each of which a voltage from node ND1 is inputted, and variable resistor R102 connected between node Np and node Nn and controlled by a control signal. Variable resistor R102 is a variable resistor that is disposed between pMOS transistor TR101 and nMOS transistor TR102 and has resistance value Rn.

Inverter INV103 is an example of a second inverter that outputs an output signal to node ND2 when the signals are inputted to node Np and node Nn. Node ND2 is an example of a third node. Inverter INV103 includes pMOS transistor TR103 connected to node Np that is an output node of pMOS transistor TR101, and nMOS transistor TR104 connected to node Nn that is an output node of nMOS transistor TR102.

Figure 2:
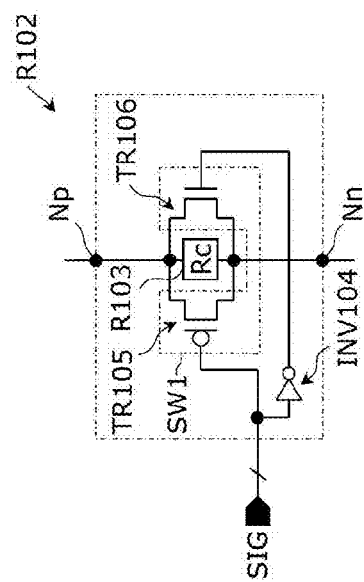
FIG. 2 is a circuit diagram illustrating a variable resistor of FIG. 1.

FIG. 2 is a circuit diagram illustrating variable resistor R102. R103 denotes a resistor that has resistance value Rc, SW1 denotes a switch that includes pMOS transistor TR105 and nMOS transistor TR106, and INV104 denotes an inverter that outputs an inverted logic signal of control signal SIG. As illustrated in FIG. 2, variable resistor R102 includes resistor R103 and switch SW1. Resistor R103 is an example of a first resistor. Switch SW1 is an example of a switch that short-circuits the first resistor (i.e., resistor R103).

Here, resistance value Ron of switch SW1 when switch SW1 is ON is represented by Ron=(RPon×RNon)/(RPon+RNon), where RPon is ON-resistance between a drain and a source of pMOS transistor TR105 and RNon is ON-resistance between a drain and a source of nMOS transistor TR106. Resistor R103 and switch SW1 are designed so that resistance value Rc>resistance value Ron is satisfied.

The resistance value of variable resistor R102 is switched, by a control signal, between a value when oscillator circuit 100 is activated and a value when oscillator circuit 100 is in a steady oscillation state. More specifically, when oscillator circuit 100 is activated, the resistance value of variable resistor R102 is switched, by a control signal, to a value that is lower than a value when oscillator circuit 100 is in the steady oscillation state. In other words, resistance value Rn of variable resistor R102 is switched between resistance value Rc that is high resistance (hereinafter, referred to as high resistance Rc) and resistance value Ron that is low resistance (hereinafter, referred to as low resistance Ron), according to control signal SIG. Hereinafter, the resistance value of switch SW1 is determined according to ON-resistance of pMOS transistor TR105 and nMOS transistor TR106.

Figure 3A:
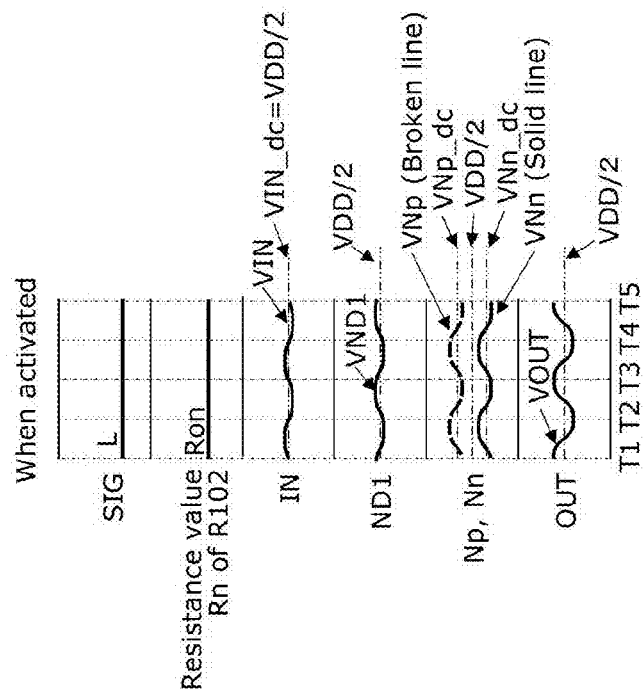
FIG. 3A is a waveform diagram when the oscillator circuit according to Embodiment 1 of the present disclosure is activated.
Figure 3B:
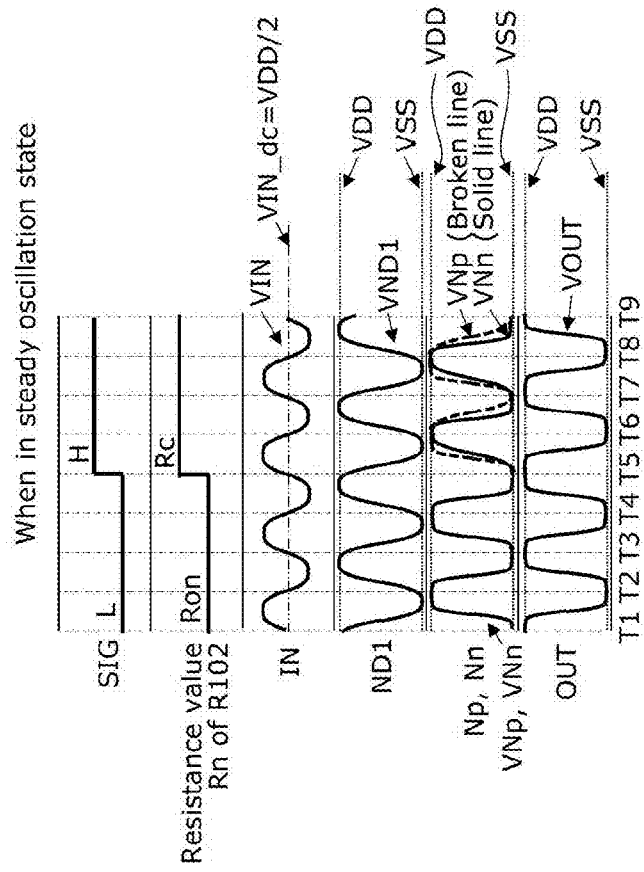
FIG. 3B is a waveform diagram when the oscillator circuit according to Embodiment 1 of the present disclosure is in a steady oscillation state.

FIG. 3A and FIG. 3B are a waveform diagram when oscillator circuit 100 according to Embodiment 1 of the present disclosure is activated and a waveform diagram when oscillator circuit 100 according to Embodiment 1 of the present disclosure is in the steady oscillation state, respectively. Operation of oscillator circuit 100 illustrated in FIG. 1 and FIG. 2 is described with reference to the waveform diagrams of FIG. 3A and FIG. 3B. It should be noted that each of inverters INV101 to INV104 is driven between power supply voltage VDD and ground VSS. Moreover, it is assumed that an output voltage of oscillator 101 is an ideal sine wave represented by VIN=αi×sin(ωt). Here, αi is an amplitude of a voltage generated by oscillator 101, i is a value counted each time output voltage VOUT is fed back to oscillator 101 from amplifier circuit A1, and the value of i is a natural number and increases by 1 from 1 that is the initial value. Moreover, ωt indicates a phase.

(When Activated)

Operation of oscillator circuit 100 when oscillator circuit 100 is activated is described with reference to FIG. 3A.

[Time T1]

At time T1, control signal SIG is set to "L". Accordingly, pMOS transistor TR105 and nMOS transistor TR106 of variable resistor R102 are brought into the ON state, and resistance value Rn between node Np and node Nn is set to low resistance Ron of switch SW1. Moreover, since voltage VOUT of output terminal OUT is fed back via feedback resistor R101, DC bias VIN_dc of inverter INV101 connected to input terminal IN becomes approximately (VDD/2).

[Time T1 to Time T2]

Voltage VIN of input terminal IN is represented by VIN=(VDD/2+α1×sin(ωt)) ... (1), based on minute voltage α1·sin(ωt) generated by oscillator 101 and DC bias VIN_dc of input terminal IN. Here, α1 is an amplitude voltage of several μV or several tens of μV, ωt is a value between 0° and 180°, and sin(ωt)≥0 is satisfied.

Next, when voltage VIN is inputted to inverter INV101, inverter INV101 inverts and amplifies voltage VIN and outputs, to node ND1, voltage VND1 represented by VND1=(VDD/2−α1×K1×sin(ωt−θ1)) ... (2). Here, K1 is voltage amplification of inverter INV101, and θ1 is a delay component that is a positive value when logic inversion is performed by inverter INV101.

Voltage VND1 of node ND1 is inputted to pMOS transistor TR101 and nMOS transistor TR102 of inverter INV102. Here, DC voltage levels of node Np and node Nn are represented by Expressions (3) and (4) below, where RPinv is ON-resistance of pMOS transistor TR101 and RNinv is ON-resistance of nMOS transistor TR102.

$$VNp\_dc = VDD \times [(Ron + RNinv)/(RPinv + Ron + RNinv)] \quad (3)$$

$$VNn\_dc = VDD \times [(RNinv)/(RPinv + Ron + RNinv)] \quad (4)$$

According to Expressions (2) to (4), voltage VNp of node Np and voltage VNn of node Nn of inverter INV102 are represented by Expressions (5) and (6) below.

$$VNp = VNp\_dc + a1 \times K1 \times K2 \times \sin(\omega t - (\theta 1 + \theta 2)) \quad (5)$$

$$VNn = VNn\_dc + a1 \times K1 \times K2 \times \sin(\omega t - (\theta 1 + \theta 2)) \quad (6)$$

Here, K2 is voltage amplification of inverter INV102, θ2 is a delay component that is a positive value when logic inversion is performed by inverter INV102, and it is assumed that no time difference occurs between node Np and node Nn since resistance value Rn of variable resistor R102 is set to low resistance Ron. Here, for example, when Ron=RPinv=RNinv and VDD=3v are satisfied in Expressions (3) and (4), according to Expressions (5) and (6), voltage VNp of node Np and voltage VNn of node Nn are represented by Expressions (7) and (8) below.

$$VNp = 2v + a1 \times K1 \times K2 \times \sin(\omega t - (\theta 1 + \theta 2)) \quad (7)$$

$$VNn = 1v + a1 \times K1 \times K2 \times \sin(\omega t - (\theta 1 + \theta 2)) \quad (8)$$

Here, according to Expressions (7) and (8), each of gate-source voltage Vgs of pMOS transistor TR103 to which VNp is inputted and gate-source voltage Vgs of nMOS transistor TR104 to which VNn is inputted of inverter INV103 can be set to Vgs around 1 v, and thus inverter INV103 can be driven. Vgs can be further increased by decreasing low resistance Ron. Accordingly, it can be seen that a transistor can be brought into the ON state even by a minute voltage generated by an oscillator when an oscillator circuit is activated.

Voltage VNp of node Np and voltage VNn of node Nn are applied to pMOS transistor TR103 and nMOS transistor TR104 of inverter INV103, respectively. When difference in DC voltage level between voltage VNp and voltage VNn is small, output voltage VOUT represented by VOUT=(VDD/2−α1×K1×K2×K3×sin (ωt−(θ1+θ2+θ3))) is outputted to output terminal OUT of amplifier circuit A1. Here, K3 is voltage amplification of inverter INV103, and θ3 is a delay component that is a positive value when logic inversion is performed by inverter INV103.

Here, a drive condition of inverter INV103 is described. Expressions (5) and (6) representing voltage VNp of node Np and voltage VNn of node Nn need to satisfy Expressions (9) and (10) below, where |Vtp1| is a threshold value of pMOS transistor TR103 and Vtn1 is a threshold value of nMOS transistor TR104.

$$|VDD - VNp| > |Vtp1| \quad (9)$$

$$VNn > Vtn1 \quad (10)$$

Here, "||" indicates an absolute value. According to Expressions (3) and (4), the relation between ON-resistance RPinv and RNinv and low resistance Ron may be represented by Expression (11) below for satisfying the condition represented by Expressions (9) and (10).

$$Ron \leq RPinv \text{ and } Ron \leq RNinv \quad (11)$$

However, it is sufficient if low resistance Ron is set to a value that satisfies Expressions (9) and (10).

Accordingly, output voltage VOUT obtained by inverting and amplifying voltage VIN of input terminal IN in amplifier circuit A1 is outputted to output terminal OUT. Since output voltage VOUT is fed back to oscillator 101, oscillator 101 generates a minute voltage represented by α2·sin(ωt), where ωt is a value between 180° and 360°, and α2>α1 and sin(ωt)≤0 are satisfied.

[Time T2 to Time T3]

Voltage VIN of input terminal IN is represented by VIN=(VDD/2+α2×sin(ωt)), based on minute voltage α2×sin(ωt) generated by oscillator 101 and DC bias VIN_dc of input terminal IN. Accordingly, amplifier circuit A1 repeats operation similar to that of [Time T1 to Time T2], and outputs, to output terminal OUT, output voltage VOUT represented by VOUT=(VDD/2−α2×K1×K2×K3×sin(ωt−(θ1+θ2+θ3))). Since output voltage VOUT is fed back to oscillator 101, oscillator 101 generates a minute voltage represented by α3×sin(ωt), where α3>α2 and 360°≤ωt≤540° are satisfied.

At time T3, the same operation as that of [Time T1 to Time T2] starts, and after this, oscillation operation is repeated while a voltage generated by oscillator 101 is amplified. Since a voltage generated by oscillator 101 and represented by αn×sin(ωt) (n is a natural number greater than or equal to 4) is amplified, output voltage VOUT of output terminal OUT becomes an oscillating signal of amplitude voltage VDD as illustrated in FIG. 3A. Thus, oscillator circuit 100 is brought into the steady oscillation state, and after this, amplitude voltage αn in a voltage generated by oscillator 101 is fixed.

As described above, oscillation operation is enabled by setting resistance value Rn of variable resistor R102 included in inverter INV102 to low resistance value Ron by control signal SIG when oscillator circuit 100 is activated. It should be noted that it is sufficient if inverter INV102 includes pMOS transistor TR101, nMOS transistor TR102, and variable resistor R102. Even when inverter INV102 includes an additional device other than the above, according to Expression (11), it is sufficient if Expression (12) below is satisfied, where Rdp is a resistance value between VDD and node Np, and Rdn is a resistance value between VSS and node Nn.

$$Ron \leq Rdp \text{ and } Ron \leq Rdn \quad (12)$$

It is sufficient if low resistance value Ron is set so that each of voltage VNp of node Np and voltage VNn of node Nn satisfying Expression (12) satisfies Expressions (9) and (10).

(When in Steady Oscillation State)

Next, circuit operation of oscillator circuit 100 in a steady oscillation state is described with reference to FIG. 3B.

[Time T1]

Control signal SIG is "L" and resistance value Rn of variable resistor R102 is set to low resistance Ron of switch SW1. Moreover, since voltage VOUT of output terminal OUT is fed back via feedback resistor R101, DC bias VIN_dc of inverter INV101 connected to input terminal IN becomes approximately (VDD/2).

[Time T1 to Time T2]

Voltage VIN of input terminal IN is represented by VIN=(VDD/2+αn×sin(ωt)), based on voltage αn×sin(ωt) generated by oscillator 101 and DC bias VIN_dc of input terminal IN. When voltage VIN is inputted to inverter INV101, inverter INV101 outputs, to node ND1, voltage VND1 represented by VND1=VDD/2−αn×K1·sin(ωt−θn), where αn×K1 is an amplitude voltage of voltage VND1 and (αn×K1)>>(VDD−VSS) is satisfied. Accordingly, voltage VND1 is oscillated between power supply voltage VDD and ground VSS. Thus, voltage VND1 of node ND1 becomes VSS (VND1=VSS). It should be noted that θn is a delay component that is a positive value when logic inversion is performed by inverter INV101.

Next, voltage VND1 (=VSS) is inputted to pMOS transistor TR101 and nMOS transistor TR102 of inverter INV102. At this time, voltage VNp of node Np and voltage VNn of node Nn become amplitude voltage VDD (VNp=VNn=VDD).

Voltage VNp of node Np and voltage VNn of node Nn are applied to pMOS transistor TR103 and nMOS transistor TR104 of inverter INV103, respectively. Accordingly, output voltage VOUT (=VSS) is outputted to output terminal OUT. Output voltage VOUT is fed back to oscillator 101, and oscillator 101 generates αn·sin(ωt). Here, ωt is a value between 180° and 360°.

[Time T2 to Time T3]

Voltage VIN of input terminal IN is represented by VIN=(VDD/2+αn·sin(ωt)), based on voltage αn×sin(ωt) generated by oscillator 101 and DC bias VIN_dc of input terminal IN. Voltage VIN is inputted to inverter INV101, and inverter INV101 outputs, to node ND1, voltage VND1 (=VDD/2−αn×K1×sin(ωt−θn)). Here, since voltage VND1 is oscillated between power supply voltage VDD and ground VSS, voltage VND1 of node ND1 becomes VDD (VND1=VDD).

The same operation as that of [Time T1 to Time T2] is performed in inverter INV102 and inverter INV103, and output voltage VOUT obtained by inverting and amplifying voltage VIN of input terminal IN in amplifier circuit A1 is outputted to output terminal OUT. Since output voltage VOUT is fed back to oscillator 101, oscillator 101 generates minute voltage αn×sin(ωt). Here, 360°≤ωt≤540° is satisfied. At [Time T4], oscillator circuit 100 is brought into the same state as that at [Time T1], and the above-described operation is repeated. Accordingly, an oscillating signal of amplitude voltage VDD is regularly outputted from output terminal OUT.

[Time T5]

At time T5, control signal SIG is changed from "L" to "H". Accordingly, pMOS transistor TR105 and nMOS transistor TR106 of variable resistor R102 are brought into the OFF state, and resistance value Rn of variable resistor R102 is switched from low resistance value Ron to high resistance Rc of resistor R103. After this, operation of buffer circuit BUF101 in which circuit operation has been switched by switching control signal SIG from "L" to "H" is described.

[Time T5 to Time T6]

Voltage VND1 of node ND1 is transitioned from VDD to VSS and inputted to inverter INV102. Accordingly, nMOS transistor TR102 and pMOS transistor TR101 of inverter INV102 are brought into the OFF state and the ON state, respectively.

Since pMOS transistor TR101 is brought into the ON state, voltage VNp of node Np is transitioned from VSS to VDD and pMOS transistor TR103 of inverter INV103 is brought into the OFF state. Meanwhile, voltage VNn of node Nn is transitioned from VSS to VDD via variable resistor R102 that has been set to high resistance value Rc. Accordingly, nMOS transistor TR104 of inverter INV103 is brought into the ON state, and voltage VOUT of output terminal OUT is transitioned from VDD to VSS.

Here, since transition of voltage VNn of node Nn is delayed by a time set by time constant τr, a through current from pMOS transistor TR103 to nMOS transistor TR104 of inverter INV103 can be suppressed. Here, time constant τr is represented by τr=Rc·Cn (Cn is gate capacitance and the like of nMOS transistor TR104 of inverter INV103), pMOS transistor TR103 and nMOS transistor TR104 of inverter INV103 during a logic transition can be set to the OFF-OFF state by setting resistance value Rn to high resistance value Rc, and a through current can be suppressed.

[Time T6 to Time T7]

During time T6 to time T7, voltage VND1 of node ND1 is transitioned from VSS to VDD and inputted to inverter INV102. Accordingly, pMOS transistor TR101 and nMOS transistor TR102 of inverter INV102 are brought into the OFF state and the ON state, respectively.

Since nMOS transistor TR102 is brought into the ON state, voltage VNn of node Nn is transitioned from VDD to VSS and nMOS transistor TR104 of inverter INV103 is brought into the OFF state. Meanwhile, voltage VNp of node Np is transitioned from VDD to VSS via variable resistor R102 of which resistance value Rn has been set to high resistance value Rc. Accordingly, transition of pMOS transistor TR103 of inverter INV103 to the ON state is delayed with respect to transition of nMOS transistor TR104 to the OFF state, and voltage VOUT of output terminal OUT is transitioned from VSS to VDD.

Here, since transition of voltage VNp of node Np is delayed by time set by time constant τf, a through current from pMOS transistor TR103 to nMOS transistor TR104 of inverter INV103 can be suppressed. Time constant τf is represented by τf=Rc·Cp (Cp is gate capacitance and the like of pMOS transistor TR103 of inverter INV103), pMOS transistor TR103 and nMOS transistor TR104 of inverter INV103 during a logic transition can be set to the OFF-OFF state by setting resistance value Rn to high resistance value Rc, and wasteful current consumption associated with a through current can be suppressed.

According to the above, since resistance value Rn of variable resistor R102 disposed between pMOS transistor TR101 and nMOS transistor TR102 of inverter INV102 is switched, by control signal SIG, to low resistance Ron when oscillator circuit 100 is activated and to high resistance Rc when oscillator circuit 100 is in the steady oscillation state, oscillator circuit 100 can perform stable oscillation operation from when oscillator circuit 100 is activated to when oscillator circuit 100 is in the steady oscillation state, and oscillator circuit 100 can be driven with low power consumption in the steady oscillation state.

It should be noted that it is sufficient if a timing at which resistance value Rn of variable resistor R102 is switched from low resistance Ron to high resistance Rc by control signal SIG is any time after oscillator circuit 100 has been transitioned from a state in which oscillator circuit 100 is activated to the steady oscillation state. Resistance value Rn of variable resistor R102 may be switched from low resistance Ron to high resistance Rc when a certain period of time has elapsed from when oscillator circuit 100 is activated, or at an arbitrary timing at which oscillator circuit 100 is driven with low power consumption.

Moreover, oscillator 101 may be a piezoelectric oscillator, such as a crystal oscillator or a ceramic oscillator. Furthermore, it is sufficient if amplifier circuit A1 includes buffer circuit BUF101, and the number of stages of inverters and the configuration of inverter INV101 included in amplifier circuit A1 are not particularly limited as long as amplifier circuit A1 can perform inversion and amplification.

Furthermore, another element, such as a capacitor for cutting DC or a dumping resistor, may be disposed between oscillator 101 and input terminal IN or between oscillator 101 and output terminal OUT. Furthermore, buffer circuit BUF101 may include a potential difference generation circuit that generates, between a first node and a second node, a potential difference that is switched by a control signal. In other words, buffer circuit BUF101 may be configured to include a potential difference generation circuit in which a differential voltage (VNp_dc−VNn_dc) between DC bias VNp_dc and DC bias VNn_dc of input voltage VNp and input voltage VNn of two-input inverter INV103 as an output stage is switched between two or more values according to a control signal. The potential difference generation circuit includes a variable resistor including a resistor and a switch that short-circuits the resistor, and may control the switch according to a control signal. Moreover, the potential difference generation circuit may be configured to include, as variable resistor R102 of inverter INV102, a diode or a diode-connected transistor and a switch. Furthermore, the potential difference generation circuit may include a resistor circuit including both or one of a resistor and a transistor, inverter INV102 may include a current regulator circuit capable of setting a plurality of current values, and the setting by the current regulator circuit may be switched according to a control signal. In other words, the potential difference generation circuit may be configured to include a current source or a current regulator circuit that is capable of setting a plurality of current values in inverter INV102, and switch, according to a control signal, the current value of inverter INV102 during a logic transition so as to switch a potential difference generated in a resistor circuit that is disposed between node Nn and node Np and includes a resistor, a transistor, a diode, and the like; however, the voltage difference generation circuit is not limited to this example as long as the same function as described above can be realized. Moreover, the switch of variable resistor R102 may be configured to include a pMOS transistor or an nMOS transistor.

(Variation 1 of Variable Resistor R102)

Figure 4:
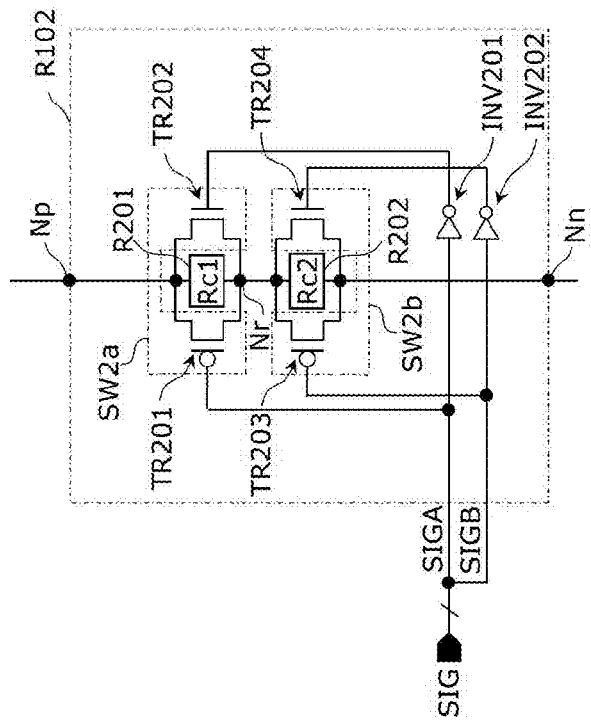
FIG. 4 is a circuit diagram illustrating Variation 1 of the variable resistor of FIG. 2.

FIG. 4 illustrates Variation 1 of variable resistor R102 according to Embodiment 1 of the present disclosure, and switch SW1 of FIG. 2 is replaced with switch SW2a and switch SW2b connected in series. Control signal SIG consists of control signal SIGA and control signal SIGB, INV201 denotes an inverter that performs logic inversion of control signal SIGA, INV202 denotes an inverter that performs logic inversion of control signal SIGB, SW2a denotes a switch including pMOS transistor TR201 and nMOS transistor TR202, SW2b denotes a switch including pMOS transistor TR203 and nMOS transistor TR204, R201 and R202 denote resistors, and Nr denotes a node between resistor R201 and resistor R202.

Resistance value Rn between node Np and node Nn is represented by Rn=Rn1+Rn2, where Rn1 is a resistance value between node Np and node Nr, Rn2 is a resistance value between node Nr and node Nn. Here, resistance value Rn1 is switched between resistance value Rc1 of resistor R201 and resistance value Ron1 of switch SW2a, by control signal SIGA. It is assumed that resistance value Ron1 is combined resistance when both of pMOS transistor TR201 and nMOS transistor TR202 are in the ON state, and is low resistance compared to resistance value Rc1. Moreover, resistance value Rn2 is switched between resistance value Rc2 of resistor R202 and resistance value Ron2 of switch SW2b, by control signal SIGB. It is assumed that resistance value Ron2 is combined resistance when both of pMOS transistor TR203 and nMOS transistor TR204 are in the ON state, and is low resistance compared to resistance value Rc2.

A combination of resistance values of variable resistor R102 is described with reference to FIG. 4.

[Control Signal SIGA]

When control signal is set to L (SIGA=L), pMOS transistor TR201 and nMOS transistor TR202 are brought into the ON state and resistance value Rn1 between node Np and node Nr becomes resistance value Ron1 of switch SW2a. In contrast, when control signal SIGA is set to H (SIGA=H), resistance value Rn1 becomes resistance value Rc1.

[Control Signal SIGB]

When control signal SIGB is set to L (SIGB=L), pMOS transistor TR203 and nMOS transistor TR204 are brought into the ON state and resistance value Rn2 between node Nr and node Nn becomes resistance value Ron2 of switch SW2b. In contrast, when control signal SIGB is set to H (SIGB=H), resistance value Rn2 becomes resistance value Rc2.

According to the above, resistance value Rn between node Np and node Nn can be switched between (Rc1+Rc2), (Rc1+Ron2), (Ron1+Rc2), and (Ron1+Ron2), by controlling control signals SIGA and SIGB. In other words, the resistance value of variable resistor R102 can be switched between multiple values. Thus, each of time constant τr and time constant τf described in Embodiment 1 can be switched between multiple values.

Since each of time constant τr and time constant τf can be switched between multiple values, an optimal delay time can be set for node Np or node Nn even when an oscillation frequency of oscillator circuit 100 is changed, and thus a through current of inverter INV103 can be suppressed and oscillator circuit 100 can be driven with low power consumption.

(Variation 2 of Variable Resistor R102)

Figure 5:
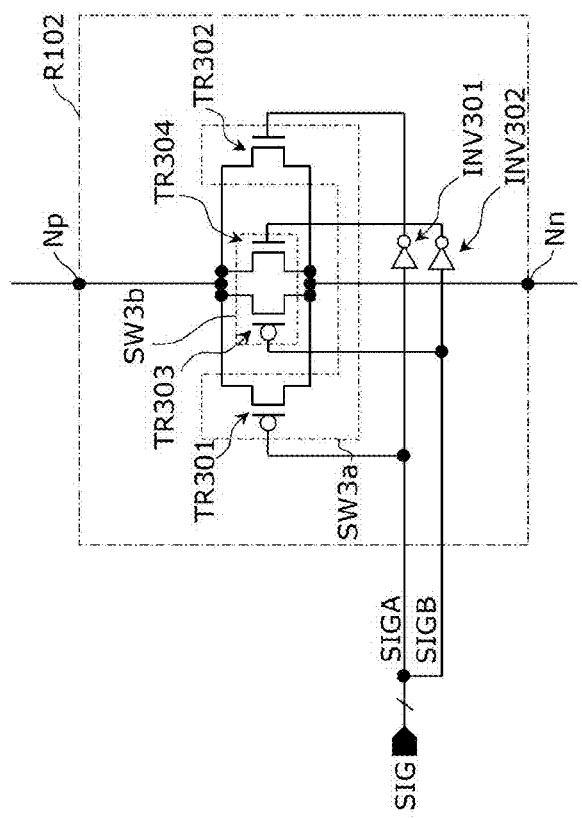
FIG. 5 is a circuit diagram illustrating Variation 2 of the variable resistor of FIG. 2.

FIG. 5 illustrates Variation 2 of variable resistor R102 according to Embodiment 1 of the present disclosure, and switch SW1 of FIG. 2 is replaced with switch SW3a and resistor R103 of FIG. 2 is replaced with switch SW3b. Control signal SIG consists of control signal SIGA and control signal SIGB, INV301 denotes an inverter that performs logic inversion of control signal SIGA, INV302 denotes an inverter that performs logic inversion of control signal SIGB, SW3a denotes a switch including pMOS transistor TR301 and nMOS transistor TR302, and SW3b denotes a switch including pMOS transistor TR303 and nMOS transistor TR304.

A combination of resistance values of variable resistor R102 is described with reference to FIG. 5.

[Control Signal SIGA]

When control signal SIGA is set to L (SIGA=L), pMOS transistor TR301 and nMOS transistor TR302 are brought into the ON state and the resistance value of switch SW3a becomes Ron1. Here, resistance value Ron1 is combined ON-resistance of pMOS transistor TR301 and nMOS transistor TR302. When control signal SIGA is set to H (SIGA=H), switch SW3a is brought into the OFF state.

[Control Signal SIGB]

When control signal SIGB is set to L (SIGB=L), pMOS transistor TR303 and nMOS transistor TR304 are brought into the ON state and the resistance value of switch SW3b becomes Ron2. Here, resistance value Ron2 is combined ON-resistance of pMOS transistor TR303 and nMOS transistor TR304. When control signal SIGB is set to H (SIGB=H), switch SW3b is brought into the OFF state.

Here, resistance value Ron2 of switch SW3b may be set to a high resistance value by setting, to a small ratio, the channel width to channel length ratio (i.e., gate width to gate length ratio) of each of pMOS transistor TR303 and nMOS transistor TR304, and resistance value Ron2 of switch SW3b is set to a resistance value higher than resistance value Ron1 of switch SW3a. Thus, variable resistor R102 includes a plurality of transistors that are different in gate width to gate length ratio that is a transistor size ratio.

According to the above, resistance value Rn between node Np and node Nn can be switched between Ron1, Ron2, and parallel resistance of Ron1 and Ron2, by controlling control signals SIGA and SIGB. Accordingly, each of time constant τr and time constant τf described in Embodiment 1 can be switched between multiple values.

Since each of time constant τr and time constant τf can be switched between multiple values, an optimal delay time can be set for node Np or node Nn even when an oscillation frequency of oscillator circuit 100 is changed, and thus a through current of inverter INV103 can be suppressed and oscillator circuit 100 can be driven with low power consumption. Moreover, since each of time constant τr and time constant τf is set by ON-resistance of a transistor, a circuit area of variable resistor R102 can be made small.

According to the above, since variable resistor R102 is configured to include a combination of a plurality of transistors and the resistance value of variable resistor R102 is controlled by a control signal, stable oscillation can be realized when oscillator circuit 100 is activated and oscillator circuit 100 can be driven with low power consumption in the steady oscillation state. It is also possible to realize a small layout area by further realizing variable resistor R102 by ON-resistance of a transistor.

It should be noted that, in variable resistor R102, when resistance value Rn between node Np and node Nn is set, the number of transistors connected in parallel is not particularly limited and a switch may be provided by connecting transistors in series.

(Variation 1 of Buffer Circuit BUF101)

Figure 6:
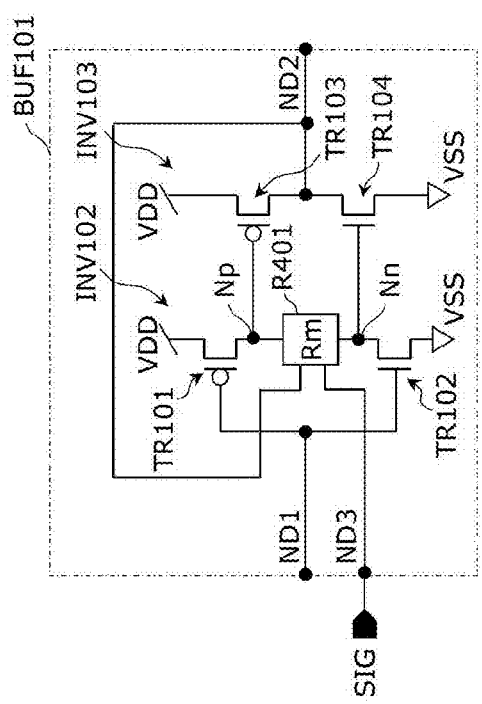
FIG. 6 is a circuit diagram illustrating Variation 1 of a buffer circuit of FIG. 1.

FIG. 6 illustrates Variation 1 of buffer circuit BUF101 according to Embodiment 1 of the present disclosure, and variable resistor R102 of FIG. 1 is replaced with variable resistor R401 that is controlled by control signal SIG and voltage VOUT of node ND2. Here, node ND2 and output terminal OUT have the same potential and the same voltage VOUT, and variable resistor R401 has resistance value Rm.

Figure 7:
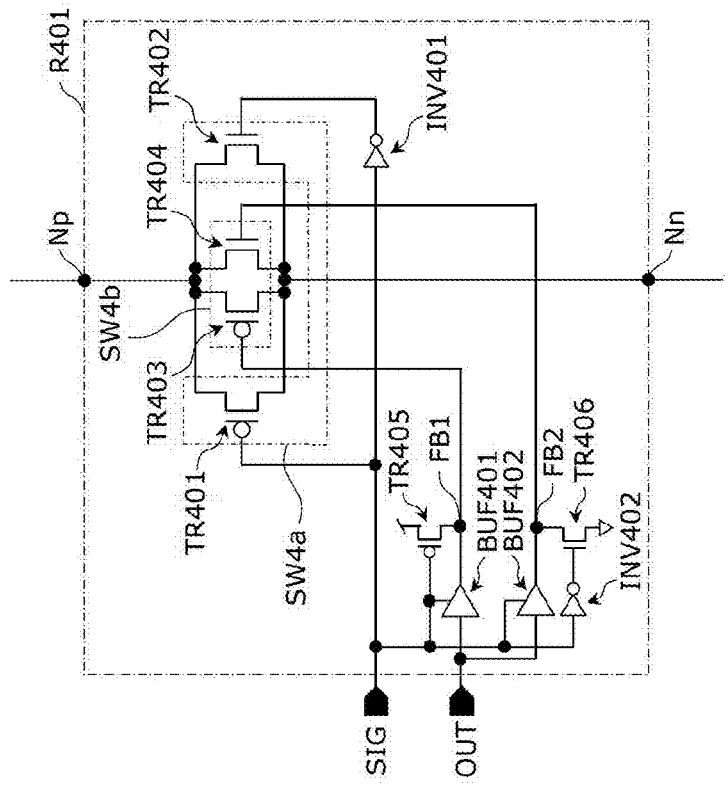
FIG. 7 is a circuit diagram illustrating Variation 3 of the variable resistor of FIG. 2.

FIG. 7 is a configuration of variable resistor R401, and illustrates Variation 3 of variable resistor R102 of FIG. 2. In FIG. 7, switch SW1 of FIG. 2 is replaced with switch SW4a including pMOS transistor TR401 and nMOS transistor TR402, and resistor R103 is replaced with switch SW4b that is used by switching pMOS transistor TR403 and nMOS transistor TR404 by control signal SIG and voltage VOUT of output terminal OUT. Here, each of the resistance value of switch SW4a in the ON state and the resistance value of switch SW4b in the ON state is resistance value Ron4. Moreover, the resistance value of switch SW4b when pMOS transistor TR403 is in the ON state and the resistance value of switch SW4b when nMOS transistor TR404 is in the ON state are RPon4 and RNon4, respectively, and the threshold value of switch SW4b when pMOS transistor TR403 is in the ON state and the threshold value of switch SW4b when nMOS transistor TR404 is in the ON state are |Vtp4| and |Vtn4|, respectively.

Furthermore, BUF401 and BUF402 denote buffer circuits that logically output Hiz or voltage VOUT to node FB1 and node FB2 according to control signal SIG and voltage VOUT of output terminal OUT, TR405 and TR406 denote a pMOS transistor that sets node FB1 to VDD when control signal SIG is L and an nMOS transistor that sets node FB2 to VSS when control signal SIG is L, respectively, and each of INV401 and INV402 denotes an inverter that inverts the logic of control signal SIG.

Figure 8:
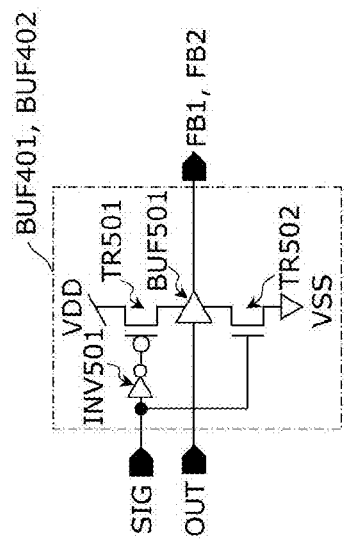
FIG. 8 is a circuit diagram illustrating a buffer circuit in Variation 3 of the variable resistor of FIG. 7.

FIG. 8 is a circuit diagram of buffer circuit BUF401 and buffer circuit BUF402.

Control signal SIG and voltage VOUT of output terminal OUT are inputted to buffer circuit BUF401 and buffer circuit BUF402, and are logically outputted to node FB1 and node FB2. BUF501 denotes a buffer circuit, TR501 and TR502 denote a pMOS transistor and an nMOS transistor that control a power supply of buffer circuit BUF501, respectively, and INV501 denotes an inverter that performs logic inversion of control signal SIG.

Figure 9:
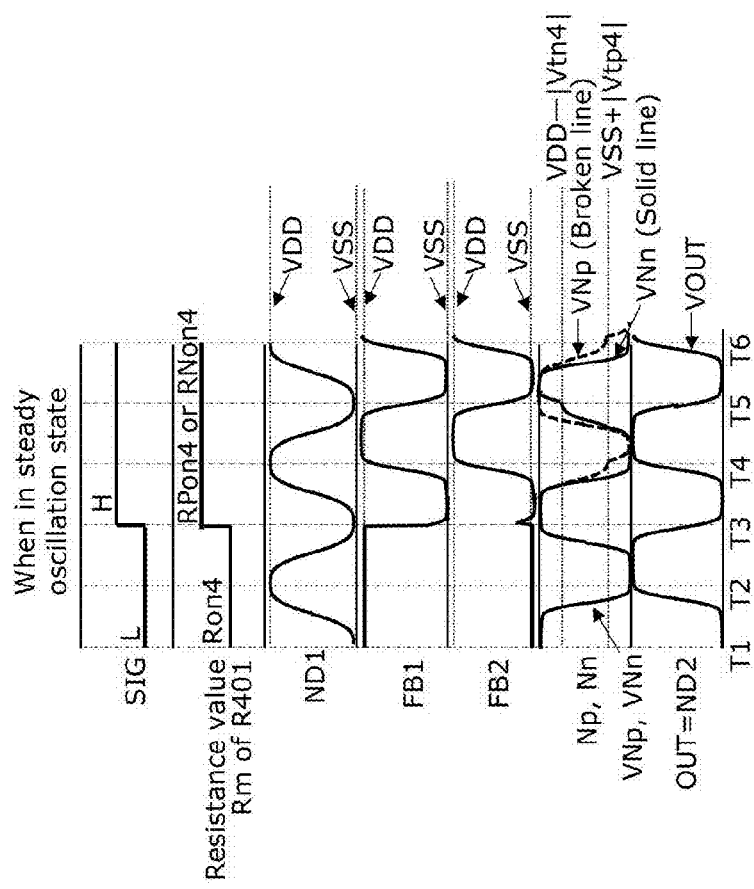
FIG. 9 is a waveform diagram illustrating operation in Variation 1 of the buffer circuit of FIG. 6.

FIG. 9 is operating waveforms of buffer circuit BUF101 when oscillator circuit 100 is in the steady oscillation state.

Operation of buffer circuit BUF101 and variable resistor R401 is described with reference to FIG. 1, FIG. 6 to FIG. 8, and the operating waveforms of FIG. 9.

[Time T1 to Time T3]

When control signal SIG is set to L (SIG=L), pMOS transistor TR401 and nMOS transistor TR402 are brought into the ON state. Meanwhile, node FB1 becomes VDD by pMOS transistor TR405, node FB2 becomes VSS by nMOS transistor TR406, and pMOS transistor TR403 and nMOS transistor TR404 are brought into the OFF state. Accordingly, resistance value Rm of variable resistor R401 becomes resistance value Ron4 of switch SW4a. Since resistance value Ron4 satisfies Expression (11) or Expression (12), oscillator circuit 100 performs stable oscillation operation.

[Time T3]

Control signal SIG is transitioned from "L" to "H". Accordingly, pMOS transistor TR401 and nMOS transistor TR402 of variable resistor R401 are brought into the OFF state. Meanwhile, buffer circuit BUF401 and buffer circuit BUF402 output, to node FB1 and node FB2, voltage VOUT (=VSS) of output terminal OUT, pMOS transistor TR403 is brought into the ON state, nMOS transistor TR404 is brought into the OFF state, and resistance value Rm of variable resistor R401 becomes resistance value RPon4.

[Time T3 to Time T4]

Voltage VND1 of node ND1 is transitioned from VSS to VDD, pMOS transistor TR101 of inverter INV102 is brought into the OFF state, and nMOS transistor TR102 is brought into the ON state. Accordingly, node Nn is transitioned from VDD to VSS, and nMOS transistor TR104 is brought into the OFF state. Meanwhile, since voltage VNp of node Np is transitioned from VDD to VSS in accordance with time constant τf set by resistance value Rm of variable resistor R401 through a logic transition in two steps, pMOS transistor TR103 is brought into the ON state.

A logic transition of voltage VNp of node Np in two steps is described as below.

First, in a first step, pMOS transistor TR403 of variable resistor R401 serves as a clamping circuit since pMOS transistor TR403 is a common drain transistor, and voltage VNp is transitioned, in accordance with time constant τf set by resistance value Rm, from VDD to VSS+|Vtp4| that is a source follower voltage of pMOS transistor TR403. Accordingly, pMOS transistor TR103 is brought into a weak ON state, and voltage VOUT of output terminal OUT (node ND2) is transitioned from "VSS" to "VDD" side. Next, in a second step, since voltage VOUT of output terminal OUT is transitioned from "VSS" to "VDD" side, pMOS transistor TR403 is brought into the OFF state, nMOS transistor TR404 is brought into the ON state, voltage VNp is transitioned from VSS+|Vtp4| to VSS in accordance with time constant τf set by resistance value Rm, and pMOS transistor TR103 of inverter INV103 is brought into the ON state. Accordingly, voltage VOUT of output terminal OUT (node ND2) is transitioned to "VDD". Here, time constant τf is set by resistance value RPon4 of pMOS transistor TR403 in the first step, and is set by resistance value RNon4 of nMOS transistor TR404 in the second step.

As described above, since a gate voltage of pMOS transistor TR103 of inverter INV103 is transitioned in two steps by using voltage clamping characteristics of variable resistor R401, current consumption by a through current from pMOS transistor TR103 to nMOS transistor TR104, fluctuation in power supply voltage VDD generated during a logic transition of the voltage of pMOS transistor TR103, and degradation in EMI characteristics can be suppressed.

Moreover, supply current to oscillator 101 can be suppressed, and a margin of an amplitude can be increased.

[Time T4 to Time T5]

Voltage VND1 of node ND1 is transitioned from VDD to VSS, pMOS transistor TR101 of inverter INV102 is brought into the ON state, and nMOS transistor TR102 is brought into the OFF state. Accordingly, voltage VNp of node Np is transitioned from VSS to VDD, and pMOS transistor TR103 is brought into the OFF state. Meanwhile, since voltage VNn of node Nn is transitioned from VSS to VDD in accordance with time constant τr set by resistance value Rm of variable resistor R401 through a logic transition in two steps, nMOS transistor TR104 is brought into the ON state.

A logic transition of voltage VNn of node Nn in two steps is described as below.

First, in a first step, nMOS transistor TR404 of variable resistor R401 serves as a clamping circuit since nMOS transistor TR404 is a common drain transistor, and voltage VNn is transitioned, in accordance with time constant τr set by resistance value Rm, from VSS to VDD−|Vtn4| that is a source follower voltage of nMOS transistor TR404. Accordingly, nMOS transistor TR104 is brought into a weak ON state, and voltage VOUT of output terminal OUT (node ND2) is transitioned from "VDD" to "VSS" side. Next, in a second step, since voltage VOUT of output terminal OUT is transitioned from "VDD" to "VSS" side, nMOS transistor TR404 is brought into the OFF state, pMOS transistor TR403 is brought into the ON state, voltage VNn is transitioned from VDD−|Vtn4| to VDD in accordance with time constant τf set by resistance value Rm, and nMOS transistor TR104 of inverter INV103 is brought into the ON state. Accordingly, voltage VOUT of output terminal OUT (node ND2) is transitioned to "VSS". Here, time constant τr is set by resistance value RNon4 of nMOS transistor TR404 in the first step, and set by resistance value RPon4 of pMOS transistor TR403 in the second step.

As described above, buffer circuit BUF101 of oscillator circuit 100 according to the present variation includes a resistor circuit that is connected between node Np and node Nn and causes a logic transition of a voltage of node Np or node Nn to occur in two steps according to a control signal and output of inverter INV103 that is in a downstream of inverter INV102. The resistor circuit includes a clamping circuit and a switch that short-circuits the clamping circuit. The clamping circuit includes a transistor and uses a source follower voltage of the transistor. Since a logic transition of an input voltage of inverter INV103 is caused to occur in two steps by using voltage clamping characteristics of variable resistor R401, current consumption by a through current of inverter INV103, fluctuation in power supply voltage VDD generated during the logic transition of the input voltage of inverter INV103, and degradation in EMI characteristics can be suppressed. Moreover, supply current to oscillator 101 can be suppressed, and a margin of an amplitude can be increased.

At [Time T5], oscillator circuit 100 is brought into the same state as that at [Time T3], and after this, the above-described operation in [Time T3 to Time T5] is repeated, power consumption and EMI are suppressed, and stable oscillation operation is performed.

It should be noted that the clamping circuit of variable resistor R401 illustrated in FIG. 7 is not limited to a common drain transistor, and the same function as the clamping circuit may be realized by using a diode and a transistor connected in parallel or the like.

Figure 10:
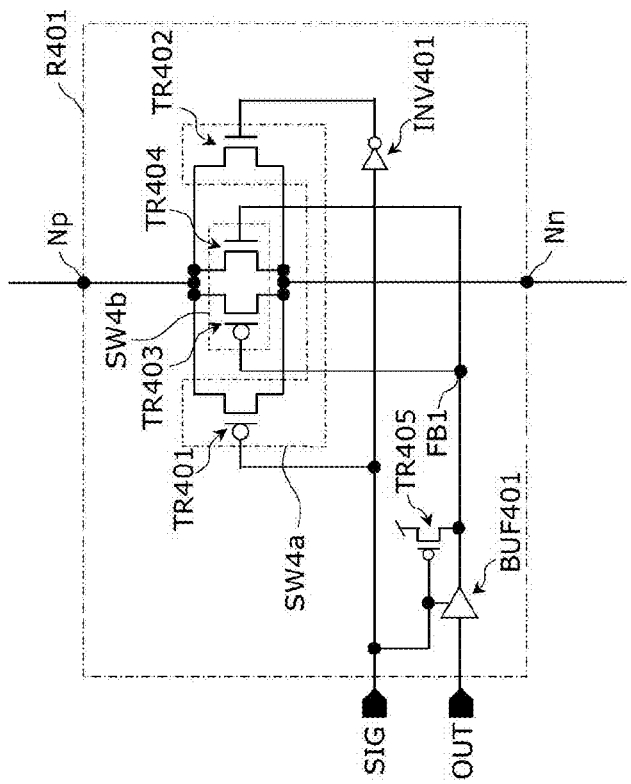
FIG. 10 is a circuit diagram illustrating Variation 4 of the variable resistor of FIG. 2.

Moreover, the same effect as the clamping circuit of variable resistor R401 can be realized by controlling a gate of pMOS transistor TR403 and a gate of nMOS transistor TR404 connected in common, as illustrated in FIG. 10.

Furthermore, means for transitioning a voltage of node Np and node Nn in two steps can be added to variable resistor R102 including a resistor and a switch between node Np and node Nn illustrated in FIG. 1.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

An oscillator circuit of the present disclosure realizes good starting characteristics, low current consumption, low EMI, and stable oscillation operation, and is applicable for extending the lifetime of a battery of a mobile phone or battery driven device.

The invention claimed is:

1. An oscillator circuit comprising:
an oscillator; and
an amplifier circuit that amplifies a voltage of the oscillator, wherein
the amplifier circuit includes:
   a first inverter that outputs signals to a first node and a second node;
   a second inverter that outputs an output signal to a third node when the signals are inputted to the first node and the second node; and
   a variable resistor connected between the first node and the second node and controlled by a control signal, and
wherein a resistance value of the variable resistor is switched, by the control signal, between a value when the oscillator circuit is activated and a value when the oscillator circuit is in a steady oscillation state.

2. The oscillator circuit according to claim 1, wherein the variable resistor includes:
   a first resistor; and
   a switch that short-circuits the first resistor.

3. The oscillator circuit according to claim 1, wherein the variable resistor includes a plurality of transistors that are different in gate width to gate length ratio that is a transistor size ratio.

4. The oscillator circuit according to claim 1, wherein a resistance value of the variable resistor is switchable between multiple values.

5. The oscillator circuit according to claim 1, wherein when the oscillator circuit is activated, a resistance value of the variable resistor is switched, by the control signal, to a value that is lower than a value when the oscillator circuit is in a steady oscillation state.

6. An oscillator circuit comprising:
an oscillator; and
an amplifier circuit that amplifies a voltage of the oscillator, wherein
the amplifier circuit includes:
   a first inverter that outputs signals to a first node and a second node;
   a second inverter that outputs an output signal to a third node when the signals are inputted to the first node and the second node; and
   a resistor circuit that is connected between the first node and the second node and causes a logic transition of a voltage of the first node or the second node to occur in two steps, according to a control signal and an output of an inverter located downstream of the first inverter, and
wherein the resistor circuit includes:
   a clamping circuit; and
   a switch that short-circuits the clamping circuit.

7. The oscillator circuit according to claim 6, wherein the clamping circuit includes a transistor and uses a source follower voltage of the transistor.

* * * * *